United States Patent
Wang

(10) Patent No.: US 11,294,335 B2
(45) Date of Patent: Apr. 5, 2022

(54) METHOD, DEVICE AND COMPUTER-READABLE MEDIUM OF MANAGING A CLOCK CIRCUIT

(71) Applicant: Nokia Solutions and Networks Oy, Espoo (FI)

(72) Inventor: Chunlin Wang, Shanghai (CN)

(73) Assignee: Nokia Solutions and Networks Oy, Espoo (FI)

( * ) Notice: Subject to any disclaimer, the term of this patent is extended or adjusted under 35 U.S.C. 154(b) by 56 days.

(21) Appl. No.: 16/853,948

(22) Filed: Apr. 21, 2020

(65) Prior Publication Data

US 2020/0341431 A1 Oct. 29, 2020

(30) Foreign Application Priority Data

Apr. 25, 2019 (CN) .......................... 201910339709.7

(51) Int. Cl.
| | | |
|---|---|---|
| *H04Q 11/00* | (2006.01) | |
| *G04F 5/04* | (2006.01) | |
| *H03K 5/135* | (2006.01) | |
| *H03K 5/156* | (2006.01) | |

(52) U.S. Cl.
CPC .............. *G04F 5/04* (2013.01); *H03K 5/135* (2013.01); *H03K 5/1565* (2013.01); *H04Q 11/0067* (2013.01); *H04Q 2011/0064* (2013.01)

(58) Field of Classification Search
CPC ........ G04F 5/04; H03K 5/135; H03K 5/1565; H04Q 11/0067; H04Q 2011/0064
See application file for complete search history.

(56) References Cited

U.S. PATENT DOCUMENTS

| | | | | |
|---|---|---|---|---|
| 8,559,381 B2* | 10/2013 | Ojala | .................... | H04L 1/1854 |
| | | | | 370/329 |
| 8,798,032 B2* | 8/2014 | Tirkkonen | ............ | H04J 3/0638 |
| | | | | 370/350 |
| 9,392,061 B2* | 7/2016 | Fredette | .............. | H04L 43/0864 |

FOREIGN PATENT DOCUMENTS

| | | |
|---|---|---|
| CN | 101213782 A | 7/2008 |
| CN | 102447510 A | 5/2012 |
| CN | 103703703 A | 4/2014 |
| EP | 2737645 A1 | 6/2014 |
| WO | WO-2008/112194 A1 | 9/2008 |

OTHER PUBLICATIONS

L. Valcarenghi et al.; "Energy Efficiency in Passive Optical Networks: Where, When, and How?"; IEEE Network; Nov./Dec. 2012; pp. 61-68.

* cited by examiner

*Primary Examiner* — Dinh T Le
(74) *Attorney, Agent, or Firm* — Harrington & Smith

(57) ABSTRACT

Embodiments of the present disclosure provide a data buffering method, electronic device and computer-readable medium. The method includes receiving, at a first node of a network, time window information from a second node of the network, the time window information defining a time window when data is transmitted from the first node to the second node. The method further includes enabling a first clock circuit of the first node at least partly based on the time window information to provide a first clock signal for data transmission from the first node to the second node. Therefore, the power consumption at the first node can be effectively reduced.

17 Claims, 6 Drawing Sheets

METHOD, DEVICE AND COMPUTER-READABLE MEDIUM OF MANAGING A CLOCK CIRCUIT

FIELD

Embodiments of the present disclosure generally relate to the field of communications, and more specifically, to a method, device and computer-readable medium of managing a clock circuit.

BACKGROUND

In a legacy network communication, one-to-many topology, such as Passive Optical Network (PON), is a common network topological structure. To fulfill synchronous communication of upstream and downstream data, both the transmitter and the receiver should maintain corresponding clock circuits.

In recent years, with the significant boost of the data communication rate, the performance requirements of the clock management circuit in a device are increasing. As a clock circuit with higher frequency becomes widely used for managing device and controlling upstream and downstream data transmission, the power consumption of the network node increases significantly. However, so far there is no effective mechanism of managing a clock circuit, which can maintain the normal communication of the network node while reducing the power consumption of the network node.

SUMMARY

In accordance with embodiments of the present disclosure, there is provided a solution for managing a clock circuit in the transmission network.

In accordance with a first aspect of the present disclosure, there is provided a method of managing a clock circuit, comprising: receiving, at a first node of a network, time window information from a second node of the network, the time window information defining a time window for transmitting data from the first node to the second node; and enabling, at least partly based on the time window information, a first clock circuit of the first node to provide a first clock signal for data transmission from the first node to the second node.

In accordance with a second aspect of the present disclosure, there is provided an electronic device, comprising: a processor; and a memory coupled to the processor and stored with instructions therein. The instructions, when executed by the processor, cause the electronic device to: receive, at a first node of a network, time window information from a second node of the network, the time window information defining a time window for transmitting data from the first node to the second node; and enable, at least partly based on the time window information, a first clock circuit of the first node to provide a first clock signal for data transmission from the first node to the second node.

In accordance with a third aspect of the present disclosure, there is provided a computer-readable medium with computer-readable program instructions stored thereon for executing the method according to the first aspect.

It should be appreciated that the contents described in this Summary are not intended to identify key or essential features of the embodiments of the present disclosure, or limit the scope of the present disclosure. Other features of the present disclosure will be understood more easily through the following description.

BRIEF DESCRIPTION OF THE DRAWINGS

Through the following detailed description with reference to the accompanying drawings, the above and other features, advantages and aspects of every embodiment of the present disclosure will become more apparent. In the drawings, same or similar reference signs represent same or similar elements, wherein.

DETAILED DESCRIPTION OF EMBODIMENTS

Figure 1:
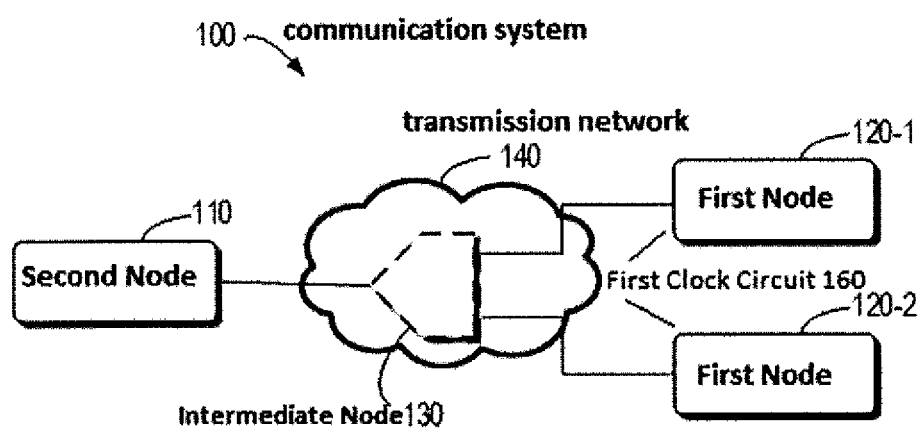
FIG. 1 illustrates a communication system in which embodiments of the present disclosure can be implemented.

Preferred embodiments of the present disclosure will be described in more detail below with reference to the accompanying drawings. Although the drawings illustrate some specific embodiments of the present disclosure, it should be appreciated that the present disclosure can be implemented in various manners and should not be limited to the embodiments explained herein. On the contrary, the embodiments are provided to make the present disclosure more thorough and complete and to fully convey the scope of the present disclosure to those skilled in the art.

As used herein, the term "include" and its variants are to be read as open-ended terms that mean "include, but is not limited to." The term "or" is to be read as "and/or" unless the context clearly indicates otherwise. The term "based on" is to be read as "based at least in part on." The terms "one example embodiment" and "one embodiment" are to be read as "at least one example embodiment." The term "a further embodiment" is to be read as "at least a further embodiment." The terms "first", "second" and so on can refer to same or different objects unless indicated otherwise.

As used herein, the term "first node" refers to any suitable entities or nodes for communications in the network and sometimes is also known as transmission node. For ease of discussion, Optical Network Unit (ONU) acts as an example of the first node in some embodiments.

As used herein, the term "second node" refers to any suitable entities or nodes for communications in the network and sometimes is also known as transmission node. For ease of discussion, Optical Line Terminal (OLT) acts as an example of the second node in some embodiments.

As used herein, the term "Optical Line Terminal" or "OLT" refers to a device that acts as service provider node and provides services to terminal users. OLT may provide functions, such as, photovoltaic conversion, so as to transmit the data via the optical fibers in the ODN.

As used herein, the term "Optical Network Unit" or "ONU" refers to a terminal node connected to the OLT via the optical fibers to receive the user data from the OLT.

As used herein, the term "Passive Optical Network" or "PON" refers to a network including Optical Distribution Networks (ODNs) which are composed of passive devices (such as optical splitter and optic fibers) without any active devices.

As used herein, the term "intermediate node" refers to any network elements connected between the first node and the second node. For ease of discussion, the optical splitter acts as an example of the intermediate node in some embodiments.

The term "circuitry" used herein may refer to one or more or all of the following:

(a) hardware-only circuit implementations (such as implementations in only analog and/or digital circuitry) and (b) combination of hardware circuit and software, such as (if applicable): (i) a combination of the analog and/or digital hardware circuit(s) and software/firmware; and (ii) combination of any part of the hardware processor and the software (including digital signal processor, software and memory operating together to enable apparatuses like OLT or other computing devices to perform various functions); and (c) hardware circuit(s) and/or processor(s), e.g., microprocessor(s) or a part of the microprocessor(s) requiring software (e.g., firmware) for operation, but the software may not be present when it is not needed for operation.

The definition of the circuit applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in a server, a cellular network device, or other computing or network device.

The traditional one-to-many mapping network (e.g., PON network) may include a plurality of first nodes (for example, ONU) and one second node (for example, OLT). For ease of discussion, transmission from the second node to the first node is referred to as downstream transmission while the transmission from the first node to the second node is referred to as upstream transmission. In the downstream transmission, the second node transmits control frames and data frames, via the optical splitter, to respective first nodes in a broadcast manner, where each control frame or data frame carries one frame header having a first node identifier. The first node parses the downstream broadcast frame, extracts data destined for the device itself and discards other data. The upstream transmission applies the Time Division Multiplexing (TDM) technology. The second node device assigns a corresponding time window for the first node via the downstream control frames. Each of the first nodes performs the upstream data transmission only within the time window assigned by the second node. The transmission of the upstream data and the downstream data between the first node and the second node is controlled by the corresponding upstream clock and downstream clock.

The second node performs data transmission with a plurality of first nodes via the intermediate node(s) (e.g., optical splitter). In some scenarios, one second node is connected with a number of first nodes, for example, each OLT may be connected with as many as 64 or 128 ONUs.

In a practical scenario, the data transmission between the first node and the second node is intermittent, for example, there is barely any data transmission between the first node (e.g., ONU) and the second node (e.g., OLT) at night. If the first node keeps running all the time, it may cause unnecessary power consumption.

Gigabit-capable Passive Optical Network/10-Gigabit-capable Symmetric Passive Optical Network (GPON/XG-SPON) standard formulated by the International Telecommunication Union (ITU) defines operations in the OLT and the ONU devices for reducing power consumption. More specifically, GPON/XGSPON standard defines normal mode, sleep mode and doze mode for the ONU. The ONU enters the sleep mode or the doze mode when the ONU determines that the ONU and the OLT are in an inactive state. In these two modes, the upstream clock circuit may be disabled and the downstream clock circuit may be optionally disabled to arrive reducing power consumption.

The inventor has noticed that the downstream data at the first node in the traditional one-to-many mapping network may support different transmission rates, for example, the downstream transmission rate may be 1.25 Gbit/s, 2.5 Gbit/s or 10 Gbit/s etc. Similarly, the upstream transmission rate also may be 1.25 Gbit/s, 2.5 Gbit/s or 10 Gbit/s etc. The specific upstream/downstream rate may be determined according to the configurations between the users and the operators. Due to the asymmetry of the upstream transmission rate and the downstream transmission rate, the upstream clock signal and the downstream clock signal at the first node should be maintained separately.

The inventor has also noticed that the total power consumption at the first node is primarily caused by the clock circuit. In some scenarios, the power consumption caused by the clock circuit may take up to 70% of the total power consumption.

Furthermore, the inventor has noticed that the first node in the normal operating mode transmits the upstream data only in specific time slots. However, the traditional solution for reducing power consumption only stipulates that the first node may switch between different modes to reduce power consumption without stipulating how to further reduce power consumption in the normal mode.

Embodiments of the present disclosure provide a method of managing a clock circuit at the first node (e.g., ONU) to further reduce the power consumption at the first node. According to the method, the first node may further reduce the power consumption at the first node by enabling the upstream clock signal only in the time windows assigned for upstream data transmission. Besides, by controlling the upstream clock circuit and the downstream clock circuit separately, the normal running of the devices and the normal receiving of the downstream data at the first node can be guaranteed.

FIG. 1 describes a communication system 100 in which embodiments of the present disclosure can be implemented. The communication system 100 includes first nodes 120-1 and 120-2 (sometimes collectively referred to as first node 120 for the ease of description), a second node 110 and an optional intermediate node 130 (denoted by dotted line) located between the first nodes 120-1 and 120-2 and the second node 110. The first nodes 120-1 and 120-2 and the second node 110 exchange data via a transmission network 140. In addition, a first clock circuit 160 showing an indication of a first clock circuit as described in this paper.

The communications in the communication system 100 may be implemented according to any suitable communication protocols, including but not limited to, wireless communication protocols (such as, the First Generation (1G), the Second Generation (2G), the Third Generation (3G), the Fourth Generation (4G) and the Fifth Generation (5G) cellular communication protocols and wireless local area network communication protocols such as, Institute of Electrical and Electronic Engineers (IEEE) 802.11 etc.), Ethernet Transmission Protocol stipulated by IEEE 802.3, optical network transmission protocols stipulated by International Telecommunication Union Standardization Sector (ITU-T) and Internet Engineering Task Force (IETF) and/or any other protocols which are currently known or to be developed. It should be appreciated that the solution in accordance with the embodiments of the present disclosure may be similarly applied into various types of communication systems.

It should be appreciated that although FIG. 1 illustrates two first nodes (i.e., first nodes 120-1, 120-2), one second node 110 and one optional intermediate node 130, the above numbers of the first nodes, the second nodes and the intermediate nodes are only exemplary and non-restrictive. The communication system 100 may include any suitable number of first nodes, second nodes and intermediate nodes to satisfy different traffic requirements in other embodiments.

The solution of managing a clock circuit in accordance with various embodiments of the present disclosure is described below in detail with reference to the accompanying drawings.

Figure 2:
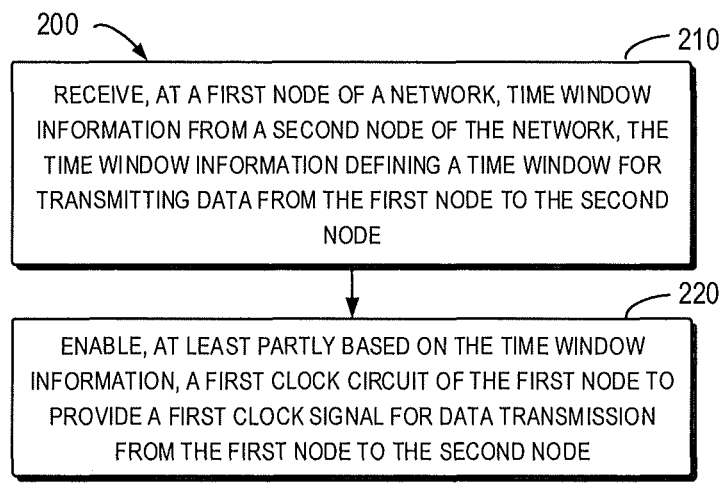
FIG. 2 illustrates a flowchart of an example method in accordance with some embodiments of the present disclosure.

FIG. 2 illustrates a flowchart of a method 200 in accordance with some embodiments of the present disclosure. The method 200 may be implemented at the first node 120 shown by FIG. 1.

At block 210, the first node 120 receives a control message from the second node 110, where the control message may carry time window information defining a time window for transmitting data from the first node 120 to the second node 110.

A procedure regarding how the second node 110 assigns a time window for upstream data transmission to the first node 120 is now schematically explained with reference to FIG. 3, which illustrates an example mapping 300 between the time window information transmitted by the second node 110 and the time window at the first node 120 in some embodiments of the present disclosure. It should be appreciated that although FIG. 3 only demonstrates two first nodes and one second node, the number of the first nodes and the second nodes is only exemplary and non-restrictive. In other embodiments, there may be any number of the first nodes and the second nodes.

Figure 3:
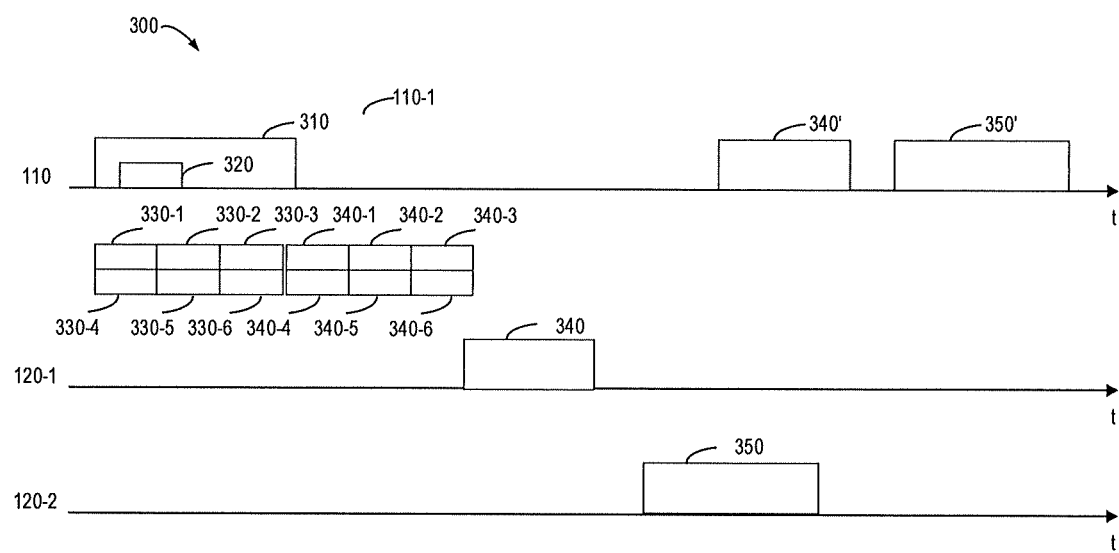
FIG. 3 illustrates an example mapping between time information transmitted by the second node and the time window at the first node in accordance with some embodiments of the present disclosure.

Referring to FIG. 3, the second node 110 transmits the control information 310 to the first nodes 120-1 and 120-2 in a broadcast manner. In some example embodiments, the control information 310 may be a downstream physical control frame and may carry the information indicating the time window for the first nodes 120-1 and 120-2. In some example embodiments, the information indicating the time window may be a bandwidth map (BWmap) field, such as BWmap 320 in FIG. 3.

The BWmap 320 indicates the time windows assigned to the first nodes 120-1 and 120-2 by the second node 110. For example, the BWmap 320 includes node identification information fields 330-1 and 340-1, time widow start fields 330-2 and 340-2 and bandwidth allocation grant size fields 330-3 and 340-3 corresponding to the first nodes 120-1 and 120-2, respectively.

At the first node 120-1, the time window information transmitted to the first node 120-1 by the second node 110 is obtained according to the node identification information field 330-1 carried in the control message 310, wherein the time window information includes the time window start field 330-2 and the bandwidth allocation grant size field 330-3. More specifically, the first node 120-1 first identifies and matches a node identification 330-4 corresponding to the node identification information field 330-1, and then further extracts the start time 330-5 and the bandwidth allocation grant size 330-6 corresponding to the start field 330-2 and the bandwidth allocation grant size field 330-3, respectively, where the start field 330-2 and the bandwidth allocation grant size field 330-3 correspond to the node identification 330-4, so as to determine an upstream transmission time window 340 for the first node 120-1.

At the first node 120-2, the time window information transmitted to the first node 120-2 by the second node 110 is obtained according to the node identification information field 340-1 carried in the control message 310, where the time window information includes the time window start field 340-2 and the bandwidth allocation grant size field 340-3. More specifically, the first node 120-2 first identifies and matches a node identification 340-4 corresponding to the node identification information field 340-1, and then further extracts the start time 340-5 and the bandwidth allocation grant size 340-6 corresponding to the start field 340-2 and the bandwidth allocation grant size field 340-3, respectively, where the start time 340-5 and the bandwidth allocation grant size 340-6 correspond to the node identification 340-4, so as to determine an upstream transmission time window 350 for the first node 120-2.

Correspondingly, the second window 110 receives the upstream data from the first nodes 120-1 and 120-2 in the time window 340' and the time window 350', respectively.

It should be noted that the approach of indicating the time window with BWmap is just exemplary, rather than restrictive. In other embodiments, the downstream control message may be selected according to the related communication network. In some example embodiments, the downstream control message may be any control messages transmitted to the first node 120 by the second node 110.

In addition, it also should be noted the information used to indicate the time window (i.e., the time window start field and the bandwidth allocation grant size) is also exemplary, rather than restrictive. In some example embodiments, the information indicating the time window may take any other form.

In some example embodiments, the information indicating the time window includes reference point information of the time window, wherein the reference point may indicate the start position, the middle position or the end position of the time window.

Alternatively or in addition, in some example embodiments, the information indicating the time window includes duration of the time window. The duration may be represented in any form, such as, a specific time period or other parameters which have a mapping relationship with the duration (e.g., such as bandwidth).

Alternatively or in addition, in some embodiments, the information indicating the time window includes a relationship between the reference point and the duration, e.g., positional relationship between the duration and the reference point and so on.

It should be noted that the reference point of the time window, the duration of the time window and the relationship between the reference point and the duration may be parameters preconfigured in the communication system and also may be indicated or omitted according to the specific configuration.

Through the above operations, the first node 120 obtains the time window information for the upstream data transmission configured by the second node 110. Referring back to FIG. 2, the first node 120 enables, at the block 220, the first clock signal of the first node 120 based on the corresponding time window information obtained at the block 210. The first clock circuit provides first clock signals to the data transmission from the first node 120 to the second node 110.

The management of a clock circuit at the first node 120 is now schematically explained with reference to FIG. 4, which illustrates an example mapping 400 between the operations managing a clock circuit at the first node 120 and the time windows in accordance with some embodiments of the present disclosure. It should be appreciated that although FIG. 4 only illustrates two first nodes 120-1 and 120-2, the number of the first nodes is just exemplary, rather than restrictive. In other embodiments, there may be any number of the first nodes.

Figure 4:
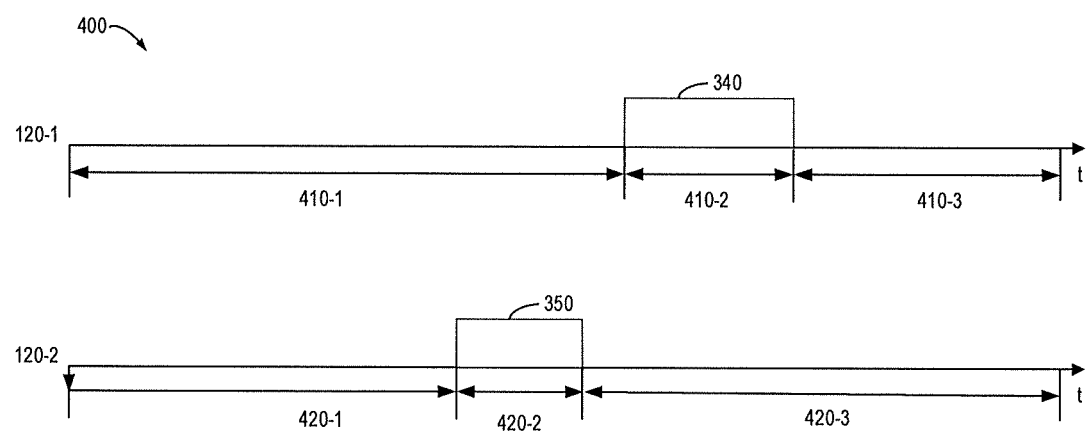
FIG. 4 illustrates an example mapping between the operations for managing a clock circuit and the time windows at the first node in accordance with some embodiments of the present disclosure.

As shown in FIG. 4, the corresponding time window for upstream data transmission of the first node 120-1 is the time period 340. Accordingly, the first node 120-1 enables the first clock circuit only in the time period 410-2 and disables the first clock circuit in the other time periods 410-1 and 410-3.

The corresponding time window for upstream data transmission at the first node 120-2 is the time period 350, such that the first node 120-2 enables the first clock circuit only in the time period 420-2 and disables the first clock circuit in the other time periods 420-1 and 420-3.

It should be understood that the time for enabling the first clock circuit does not have to strictly correspond to the time window for the upstream data transmission. In some example embodiments, some margin may be considered and added. In this case, the time period for enabling the first clock circuit may be longer than the time window for the upstream data transmission.

Alternatively or in addition, the first node 120 may also take into account other factors when executing the operations for enabling the first clock circuit. For example, the first node 120 may determine whether there is data to be transmitted to the second node 110 and the first clock circuit is enabled only if there is data to be transmitted to the second node 110. In this way, unnecessary enabling of the first clock circuit may be further reduced.

As the first clock circuit at the first node 120 is enabled based on the assigned time window for the upstream data transmission, the duration of enabling the first clock circuit is reduced. Therefore, the power consumption caused by the operation of the clock circuit at the first node 120 would be reduced in the normal operating mode.

Besides, in order to ensure that the first node 120 can normally receive the downstream data from the second node 110, the first clock circuit for controlling the data transmission from the first node 120 to the second node 110 may be independent of the second clock circuit for controlling the data transmission from the second node 110 to the first node 120. As an example instead of a restriction, the first node 120 receives from the second node 110 the downstream data frames, from which the clock reference signal can be recovered. The second clock circuit may generate the second clock signal based on the clock reference signal (i.e., downstream clock signal).

In some example embodiments, the first clock circuit also may be generated based on the reference clock signal recovered from the downstream data frames. It should be understood that there are multiple ways to generate the first clock signal and the second clock signal based on the reference clock signal, for example, by using a circuit including the phase locked loop and the oscillator etc. Besides, in some example embodiments, the first clock signal and the second clock signal may also be generated in other ways, such as external timing.

In this way, the first node 120 operates the first clock circuit for the upstream data transmission and the second clock circuit for the downstream data receiving separately, such that the second clock circuit for the downstream data receiving is always enabled in the normal operating mode, which guarantees synchronization between the first node and the second node and the normal transmission of the downstream data. Meanwhile, the upstream clock circuit is enabled on demand and the power consumption at the first node is reduced accordingly.

In some example embodiments, the apparatus (e.g., the first node 120) that can execute the method 200 may comprise corresponding means for executing respective steps of the method 200. These means may be implemented in any suitable manner, for example, by circuits or software modules.

In some embodiments, the apparatus includes: means for receiving, at the first node of the network, the time window information from the second node of the network, the time window information defining a time window for transmitting the data from the first node and the second node; and means for enabling, at least partly based on the time window information, the first clock circuit of the first node to provide a first clock signal for the data transmission from the first node to the second node.

In some embodiments, the means for enabling the first clock circuit comprises: means for determining whether there is data to be transmitted to the second node; and means for enabling the first clock circuit at least partly based on the time window information according to a determination that there is data to be transmitted.

In some embodiments, the apparatus also comprises: means for recovering a reference clock signal from data transmitted from the second node to the first node and generating the first clock signal based on the recovered reference clock signal.

In some embodiments, the apparatus comprises: means for generating a second clock signal using a second clock circuit based on the reference clock signal, wherein the second clock signal is used for data transmission from the second node to the first node and the second clock circuit is different from the first clock circuit.

In some embodiments, the time window information indicates at least one of: a reference point of the time window; duration of the time window; and relationship between the reference point and the duration.

In some embodiments, the means for receiving the time window information includes: means for receiving a control message transmitted from the second node; and means for extracting the time window information from the control message.

In some embodiments, the control message includes a bandwidth map field, which defines the time window.

Figure 5:
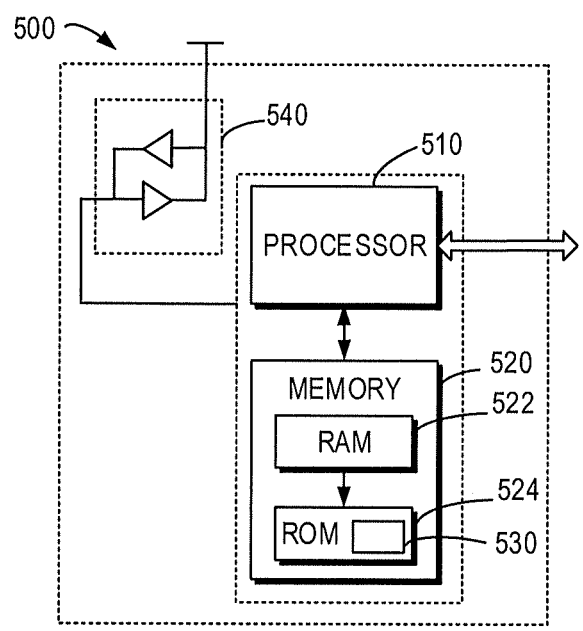
FIG. 5 illustrates a simplified block diagram of a device suitable for implementing embodiments of the present disclosure.

FIG. 5 illustrates a simplified block diagram of a device 500 suitable for implementing embodiments of the present disclosure. The device 500 may be used for realizing transmission nodes in the transmission network, such as node 102 of FIG. 1. As shown in FIG. 5, the device 500 includes one or more processors 510, one or more memories 520 coupled to the processor 510 and one or more transmitters and/or receivers (TX/RX) 540 coupled to the processor 510.

The TX/RX 540 is used for bidirectional communication and includes at least one cable/optical cable/wireless interface to promote communication. The communication interface may represent any interface necessary for communication with other devices.

The processor 510 may be of any type suitable for the local technical environment and the examples of the processor include, in a non-restrictive manner, one or more of: general-purpose computer, dedicated computer, microprocessor, Digital Signal Processor (DSP) and multi-core based processor. The device 500 may include a plurality of processors, such as dedicated integrated circuit chip following a clock synchronized with the main processor at a temporal level.

The memory 520 includes one or more non-volatile memories and one or more volatile memory devices. The examples of the non-volatile memory includes, but not limited to, Read-Only Memory (ROM) 524, Erasable Programmable Read-Only Memory (EPROM), flash, hard disk, Compact Disk (CD), Digital Versatile Disk (DVD), other magnetic storage devices and/or optical storage devices. The examples of the volatile memory may include, but are not limited to, Random Access Memory (RAM) 522 or other volatile memories that cannot persist in case of a power loss.

The computer program 530 includes computer-readable instructions, which may be stored into the ROM 522 by the associated executable programs 530 of the processor 510. The processor 510 may load the programs 530 into the RAM 524 to execute various suitable acts and processing.

The embodiments of the present disclosure may be implemented by the program 530, to allow the device 500 to execute any procedure of the present disclosure discussed above with reference to FIG. 2. Embodiments of the present disclosure also may be implemented through hardware, software or combinations thereof.

Figure 6:
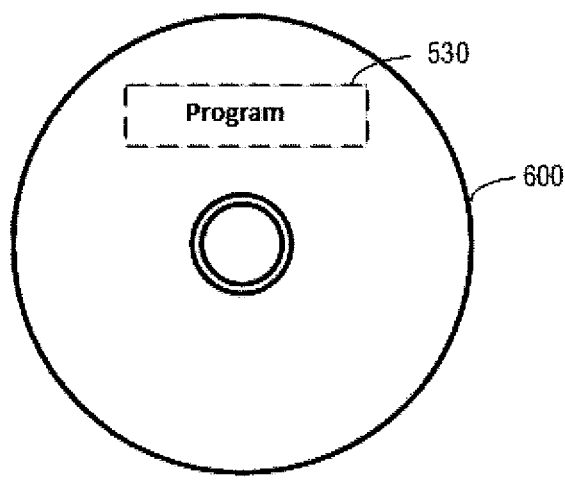
FIG. 6 illustrates a block diagram of an example computer-readable medium in accordance with some embodiments of the present disclosure.

In some embodiments, the program 530 may be tangibly included in the computer readable-medium, which computer-readable medium may be included in the device 500 (e.g., memory 520) or other storage devices accessible by the device 500. The device 500 may read the program 530 from the computer-readable medium into the RAM 524 for execution. The computer-readable medium may include various tangible non-volatile storage devices, such as ROM, EPROM, flash, hard disk, CD, DVD, etc. FIG. 6 illustrates an example of the computer-readable medium 600 in the form of CD or DVD. The computer-readable medium 600 has the program 530 stored thereon.

Generally speaking, various example embodiments of the present disclosure can be implemented in hardware, dedicated circuits, software, logic or any combination thereof. Some aspects can be implemented in hardware while other aspects can be implemented in firmware or software executed by controllers, microprocessors or other computing devices. For example, various examples (e.g., method, apparatus or device) of the present disclosure may be partially or fully implemented on the computer-readable medium. When each aspect of embodiments of the present disclosure is illustrated or described as block diagram and flowchart or represented by some other graphics, it should be understood that the block, apparatus, system, technology or method described here can be implemented in hardware, software, firmware, dedicated circuits, logic, general-purpose hardware, controller, or other computing devices, or any other combination thereof as non-restrictive examples.

Units included in the device or apparatus of the present disclosure can be implemented in various ways, including software, hardware, firmware or any combination thereof. In one embodiment, one or more units can be implemented using software and/or hardware, such as computer-executable instructions stored on the storage medium. Apart from the computer-executable instructions or as an alternative, part or all of the units in the device or apparatus can be implemented at least partly by one or more hardware logic assemblies. As an example instead of a restriction, the available exemplary types of hardware logic assemblies include Field Programmable Gate Array (FPGA), Application-Specific Integrated Circuit (ASIC), Application Standard Specific Product (ASSP), System-on-Chip (SOC), Complex Programmable Logical Device (CPLD) and the like.

As an example, embodiments of the present disclosure can be described in the context of computer-executable instructions, which are comprised in program modules executed in devices on a target physical or virtual processor for example. In general, program modules comprise routines, programs, libraries, objects, classes, components, data architecture, etc. and execute particular tasks or implement particular abstract data structure. In each embodiment, functions of the program module can be merged or divided between the described program modules and the computer-executable instructions for program modules can be executed in local or distributed devices. In the distributed devices, program modules can be positioned in local and remote storage media.

The computer program codes for implementing the method of the present disclosure can be written in one of more kinds of programming languages. The computer program codes can be provided to processors of the general-purpose computer, dedicated computer or other programmable data processing apparatuses, such that the program codes, when executed by the computer or other programmable data processing apparatuses, cause the implementation of functions/operations specified in the flowchart and/or block diagram. The program codes can be executed entirely on the computer, partially on the computer, as an independent software package, partially on the computer and partially on the remote computer or entirely on the remote computer or server.

In the context of the present disclosure, a computer-executable medium can be any tangible medium that comprises or stores programs for or related to an instruction executing system, apparatus or device. The computer-executable medium can be machine-readable signal medium or machine-readable storage medium and can comprise but is not limited to electronic, magnetic, optical, electromagnetic, infrared semiconductor system, apparatus or device, or any suitable combination thereof. The more specific examples of the machine-readable storage medium comprise an electrical connection including one or more wires, a portable computer disk, a random-access memory (RAM), a flash, a hard disk, a read-only memory (ROM), an erasable programmable read-only memory (EPROM or flash), an optical storage device, a magnetic storage device, or any suitable combination thereof.

Furthermore, although the operations are depicted in a particular order, it should be appreciated that the operations are not required to be completed in the particular order or in succession, or not all operations shown in the drawings need to be executed to obtain the expected result. In some cases, multitasking or multiprocessing is also beneficial. Likewise, although the above discussion comprises some particular implementation details, they should not be interpreted as limiting the scope of the invention or claims. On the contrary, they should be appreciated as descriptions for particular embodiments of the particular invention. Some features described separately in the context of the embodiments of the description can also be integrated and implemented in a single embodiment. Conversely, all kinds of features described in the context of a single embodiment can also be separately implemented in multiple embodiments or any suitable sub-combinations.

Although the subject matter has been described in language specific to structural features and/or methodological actions, it should be understood that the subject matter defined in the attached claims is not limited to the above described particular features or actions. On the contrary, the above described specific features and actions are disclosed for implementing examples of the claims.

I claim:

1. A method, comprising:
   managing a clock circuit, comprising:
   receiving, at a first node of a network, time window information from a second node of the network, the time window information defining a time window for transmitting data from the first node to the second node, wherein the time window information is using a first clock circuit for the transmitting data from the first node to the second node and a second clock circuit for transmitting data from the second node to the first node; and
   enabling, at least partly based on the time window information, the first clock circuit of the time window information to provide a first clock signal for data transmission from the first node to the second node.

2. The method of claim 1, wherein enabling the first clock circuit comprises:
   determining whether there is data to be transmitted to the second node; and
   according to a determination that there is data to be transmitted, enabling the first clock circuit at least partly based on the time window information.

3. The method of claim 1, further comprising:
   recovering a reference clock signal from data transmitted from the second node to the first node; and
   generating the first clock signal based on the recovered reference clock signal.

4. The method of claim 3, further comprising:
   generating, based on the reference clock signal, a second clock signal using a second clock circuit, the second clock signal being used for data transmission from the second node to the first node, the second clock circuit being different from the first clock circuit.

5. The method of claim 1, wherein the time window information indicates at least one of:
   a reference point of the time window;
   duration of the time window; and
   relationship between the reference point and the duration.

6. The method of claim 1, wherein receiving the time window information comprises:
   receiving a control message transmitted from the second node; and
   extracting the time window information from the control message.

7. The method of claim 1, wherein the control message includes a bandwidth map field defining the time window.

8. The method of claim 1, wherein the first node is an optical network unit and the second node is an optical line terminal.

9. An electronic device, comprising:
   at least one processor; and
   at least one non-transitory memory storing computer program codes,
   wherein the computer program codes stored on the at least one non-transitory memory are executed by the at least one processor to cause the electronic device to:
   receive, at a first node of a network, time window information from a second node of the network, the time window information defining a time window for transmitting data from the first node to the second node, wherein the time window information is using a first clock circuit for the transmitting data from the first node to the second node and a second clock circuit for transmitting data from the second node to the first node; and
   enable, at least partly based on the time window information, the first clock circuit of the time window information to provide a first clock signal for data transmission from the first node to the second node.

10. The device of claim 9, wherein the computer program codes are executed by the at least one processor to further cause the electronic device to:
    determine whether there is data to be transmitted to the second node; and
    according to a determination that there is data to be transmitted, enable the first clock circuit at least partly based on the time window information.

11. The device of claim 9, wherein the computer program codes are executed by the at least one processor to further cause the electronic device to:
    recover a reference clock signal from data transmitted from the second node to the first node; and
    generate the first clock signal based on the recovered reference clock signal.

12. The device of claim 11, wherein the computer program codes are executed by the at least one processor to further cause the electronic device to:
    generate a second clock signal using a second clock circuit based on the reference clock signal, the second clock signal being used for data transmission from the second node to the first node, the second clock circuit being different from the first clock circuit.

13. The device of claim 9, wherein the time window information indicates at least one of:
    a reference point of the time window;
    duration of the time window; and
    relationship between the reference point and the duration.

14. The device of claim 9, wherein the computer program codes are executed by the at least one processor to further cause the electronic device to:
    receive a control message transmitted from the second node; and
    extract the time window information from the control message.

15. The device of claim 9, wherein the control message includes a bandwidth map field defining the time window.

16. The device of claim 9, wherein the device is an optical network unit.

17. A non-transitory computer-readable medium with computer-executable instructions stored thereon, wherein the computer-executable instructions, when executed by one or more processors, cause the one or more processors to perform steps comprising:
- providing for receiving, at a first node of a network, time window information from a second node of the network, the time window information defining a time window for transmitting data from the first node to the second node, wherein the time window information is using a first clock circuit for the transmitting data from the first node to the second node and a second clock circuit for transmitting data from the second node to the first node; and
- enabling, at least partly based on the time window information, a first clock circuit of the time window information to provide a first clock signal for data transmission from the first node to the second node.

* * * * *